United States Patent
Reich et al.

(10) Patent No.: US 11,748,444 B2
(45) Date of Patent: Sep. 5, 2023

(54) DEVICE AND METHOD FOR PROCESSING DATA SAMPLES

(71) Applicant: Rohde & Schwarz GmbH & Co. KG, Munich (DE)

(72) Inventors: Friedrich Reich, Stadtbergen (DE); Markus Breunig, Munich (DE); Markus Freidhof, Kirchseeon (DE); Thomas Kuhwald, Markt Schwaben (DE); Wolfgang Herbordt, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 366 days.

(21) Appl. No.: 15/931,829

(22) Filed: May 14, 2020

(65) Prior Publication Data
US 2021/0357559 A1    Nov. 18, 2021

(51) Int. Cl.
*G06F 18/00* (2023.01)
*G06F 30/331* (2020.01)

(52) U.S. Cl.
CPC ............ *G06F 18/00* (2023.01); *G06F 30/331* (2020.01)

(58) Field of Classification Search
CPC ...... G06F 30/331; G06F 18/00; G06V 10/758
See application file for complete search history.

(56) References Cited

U.S. PATENT DOCUMENTS

2013/0275071 A1    10/2013    Carvalho et al.

OTHER PUBLICATIONS

Bosch, R. E., De Parga, A. J., Mota, B., & Musa, L. (2003). The ALTRO chip: a 16-channel A/D converter and digital processor for gas detectors. IEEE Transactions on Nuclear Science, 50(6), 2460-2469. (Year: 2003).*
Kim, H., Kim, S., Van Helleputte, N., Artes, A., Konijnenburg, M., Huisken, J., . . . & Yazicioglu, R. F. (2013). A configurable and low-power mixed signal SoC for portable ECG monitoring applications. IEEE transactions on biomedical circuits and systems, 8(2), 257-267. (Year: 2013).*

* cited by examiner

*Primary Examiner* — Bijan Mapar
(74) *Attorney, Agent, or Firm* — Westman, Champlin & Koehler, P.A.

(57) ABSTRACT

The present invention provides to a processing of data samples by an arrangement comprising a signal processing chip for executing predetermined operations and a processor for executing any kind of software code. In particular, it is not only possible that the general purpose processor, which executes the software code can process results from the signal processing chip, but also the signal processing chip can receive the results of the general purpose processor for applying further operations. In this way, the flexibility and efficiency of the processing can be further improved.

20 Claims, 3 Drawing Sheets

1A

1A

DEVICE AND METHOD FOR PROCESSING DATA SAMPLES

TECHNICAL FIELD

The present invention relates to a device for processing data samples. The present invention further relates to method for processing data samples. In particular, the present invention relates to processing of data samples by a combination of a general purpose processor and a signal processing chip.

BACKGROUND

Although so applicable in principle to any kind of a data processing device, the present invention and its underlying problem will be hereinafter described in conjunction with a measurement device.

A measurement device may receive one or more measurement signals, which may be converted to digital data samples, and the digital data samples may be further processed in order to analyze the received signal and to display the measurement results on a screen or the like. For this purpose, the measurement device may comprise specialized hardware components, which are specifically designed for predetermined operations. Accordingly, such specialized hardware components can perform the predetermined operations very efficiently within a short period of time.

However, the analysis of the data samples may further require some additional processing tasks, which cannot be performed by the specialized hardware components. For this purpose, the measurement device may comprise a general purpose processor, which can load and execute any kind of software. By adapting the software, a wide range of operations may be performed. Accordingly, the measurement device may apply some specific operations by means of the specialized hardware components and forward the result of the specialized hardware components to the general purpose processor for further operations.

However, once the general purpose processor has received the intermediate results from the specialized hardware, all further operations are performed by the general purpose processor, even if some further operations could be performed more efficiently by the specialized hardware.

Against this background, the present invention aims to provide a more efficient processing of data samples. In particular, the present invention aims to provide an efficient and versatile processing of data samples by an arrangement comprising a general purpose processor and a specialized signal processing chip for executing predefined operations. Moreover, the present invention aims to provide a versatile and efficient cooperation between a general purpose processor and one or more specialized signal processing chips.

SUMMARY OF THE INVENTION

The present invention provides a device and a method for processing that are assembled with the features of the independent claims. Further advantages embodiments are subject matter of the dependent claims.

According to a first aspect, a device for processing data samples is provided. The device for processing data samples comprises an acquisition memory, a program memory, a processor and a signal processing chip. The acquisition memory is configured to store a number of data samples. The program memory is configured to store software code. The processor is communicatively coupled with the acquisition memory and configured to receive the number of data samples stored in the acquisition memory. The processor is further communicatively coupled with the program memory and configured to read the software code stored in the program memory. Accordingly, the processor is configured to execute the received software code stored in the program memory for processing the received data samples. The signal processing chip is configured to perform predetermined processing operations. The signal processing chip is further configured to receive a processing result of the data samples processed by the processor according to the software code. In particular, the signal processing chip is configured to apply the predetermined processing operations on the processing result of the processor.

According to a further aspect, a method for processing data samples is provided. The method comprises receiving a number of data samples. The number of data samples may be stored in an acquisition memory. The receiving of the data samples may be performed by a processor. The method further comprises processing the received number of data samples. The processing is performed by executing software code. The processing of the data samples may be also performed by the processor. In particular, the processor may receive the software code to be executed from a program memory. Further, the method may comprise receiving processing results of the processor by a signal processing chip. In particular, the signal processing chip may receive the processing results of the data samples, which are processed by the processor. Finally, the method may comprise applying predetermined processing operations on the received processing results of the processor. In particular, the predetermined processing operations may be executed by the signal processing chip.

The present invention is based on the finding that a processing of data samples may be performed by an arrangement comprising at least one specialized signal processing chip for executing specified predetermined operations in conjunction with a general purpose processor, which can execute any kind of software. Usually, in a first task the signal processing chip may perform one or more predetermined operations, and subsequently, the intermediate result of the signal processing chip is forwarded to the general purpose processor for further operations. However, once the general purpose processor takes over the processing, all further operations are performed by the general purpose processor, even if the specialized signal processing chip could perform some operations more efficiently or faster.

The present invention takes into account this finding and aims to provide a versatile and more efficient processing of data samples in an arrangement comprising a specialized signal processing chip and a general purpose processor. For this purpose, the present invention additionally introduces to return intermediate results of the general purpose processor to the signal processing chip after the general purpose processor has performed processing operations on the data samples. Once the processor detects that some further operations can be performed faster or more efficiently by the signal processing chip, the results of the processor may be forwarded to the signal processing chip, and the signal processing chip may take over the further processing. In this way, the full performance capability of the signal processing arrangement can be used. Thus, the performance of the signal processing can be increased.

The processor for processing the data samples by executing software code may be any kind of appropriate general purpose processor. For instance, the processor may be a central processing unit (CPU). For example, the processor may execute an operating system that loads and executes the software code. For example, the processor may be an Intel or AMD processor that runs an operating system that loads and executes instructions of the software code stored in the program memory. However, it is understood that any other kind of processor may be possible, which can load and execute instructions of software code from a related software memory. For this purpose, the processor may be communicatively coupled with the program memory. For example, the processor may comprise a memory interface for reading the software code stored in the program memory.

The program memory may be any kind of appropriate memory for storing the software code. For example, the program memory may be a non-volatile random access memory. Accordingly, it is possible to write the software code into the memory, and this software code may be read from the processor at a later point in time. In this way, the software code can be updated or replaced. However, it is understood, that the program memory may be also a read-only memory or any other kind of memory, which can store the software code and provide the software code to the processor.

The data samples, which are processed by the processor may be provided by an acquisition memory. Accordingly, the processor may be communicatively coupled with the acquisition memory.

For example, the processor may comprise an interface for receiving the data samples from the acquisition memory or for reading the data samples stored in the acquisition memory. For example, the processor may be connected with the acquisition memory by a memory bus or the like.

The acquisition memory may be any kind of appropriate memory, for example, a random access memory. The data samples may be written into the acquisition memory by a further device. For example, the data samples may relate to digitized signals of a measurement system. Accordingly, the digitized data samples may be written into the acquisition memory in real time. The acquisition memory may be, for example, a first-in-first-out (FIFO) buffer, or a cyclic memory. However, it is understood, that any other appropriate concept for storing the data samples in the acquisition memory and providing the stored data samples from the acquisition memory to the processor may be also possible. For example, the storing of the data samples and the providing of the stored data samples may be controlled by a memory controller or the like. The memory controller may perform any appropriate control in order to allocate an appropriate memory area for storing the data samples or for identifying the memory area of stored data samples, which shall be provided to the processor.

The signal processing chip may be any kind of processing device, which can perform predetermined processing operations, in particular processing operations, which may be firmly specified in the signal processing chip. For example, the signal processing chip may be a processing device, which is specifically configured for a predetermined type of processing operations. For example, the signal processing chip may be specifically designed to prepare data in order to display the data on an output device. However, it is understood, that the signal processing chip may be also specifically designed for any other purposes such as specific floating point operations, transforms, in particular Fourier transforms, measurement analysis like identifying a maximum or minimum, rising or falling times etc. For this purpose, the signal processing chip may comprise a specific hardware structure for performing the related operations. Further, the instructions or the software code for performing the desired operations may be firmly stored in the signal processing chip. However, it may be also possible that the predetermined operations may be modified at a later point in time. The predetermined operations, which may are executed by the processing chip may by specific operations relation to processing operations which can be performed by the signal processing chip in an efficient manner. Thus, while the processor may be a general purpose processor for performing flexible processing by executing software, in particular arbitrary program code, the signal processing chip may by a specialized hardware for processing data by performing particular, predetermined operations. Thus, the operation of the signal processing chip may be limited to the predetermined, specialized operations. However, these predetermined operations may be performed in an efficient manner in terms of time and energy consumption. The data transfer between the processor and the signal processing chip may be performed in any appropriate manner. This will be described in more detail below in connection with the related embodiments. For example, the result of the processor may be directly transmitted to the signal processing chip via an appropriate communication channel. However, it may be also possible that the processor may store the processing results in a memory, for example the acquisition memory, and the signal processing chip may read the results of the processor from the respective memory. Furthermore, it is understood, that any other appropriate manner for transferring the data between the processor and the signal processing chip may be also possible.

Further embodiments of the present invention are subject of the further sub-claims and of the following description, referring to the drawings.

In a possible embodiment, each data sample comprises a number of one or more bits. In particular, each data sample may represent a digitized signal or signal value.

For example, each data sample may relate to a measurement value. Each measurement value may be acquired with a predetermined resolution. In a very simple form, a data sample may relate to a single bit. Accordingly, each data sample may be either a low value "0" or a high value "1". However, it may be also possible to acquire the individual samples by an accuracy of more bits, for example a byte of 8 bits or a data word of 16 or 32 bits. However, any other number of bits for the individual data samples may be also possible. Furthermore, it may be also possible that the number of bits per data sample may be different for the individual data samples. It may be also possible that each data sample may relate to a number of two or more values. For example, each data sample may relate to a tuple of two values, a triple of three values or the like. For example, a voltage and a current may be combined to a common data sample in a measurement system.

In a possible embodiment, the acquisition memory may comprise a shared memory. The shared memory may be used at least by the processor and the signal processing chip.

In case that the processor and the signal processing chip both have access to the same shared memory, a data exchange between the processor and the signal processing chip can be performed via this shared memory. For example, the processor may store its processing results in the acquisition memory, and subsequently the signal processing chip may read the results stored by the processor. Furthermore, the same acquisition memory may be also used from one or more further devices, for example a device, which acquires the data sample and provides the data samples to the processor and/or the signal processing chip.

In a possible embodiment, the signal processing chip comprises at least one of a field-programmable gate area (FPGA), an application specific integrated circuit (ASIC) or a digital signal processor (DSP). Furthermore, the signal processing chip may comprise a combination of a FPGA, a ASIC and/or a DSP.

Furthermore, any other signal processing chip, in particular any kind of chip, which can perform predetermined operations, for example firmly specified predetermined operations, may be also possible. Such specialized signal processing chips usually are specifically configured to perform one or more desired operations in a very efficient manner.

In a possible embodiment, the signal processing chip is configured to perform at least one of a processing of data for visualization, computing a measurement function, computing a histogram, performing a predetermined transformation operation or applying a filtering operation.

For example, the signal processing chip may process data, in particular the results of the processor in order to prepare the data for visualization such as a visualization on a display. For example, the display may be coupled to the signal processor. In this way, the signal processor may perform predetermined operations in order to provide a predetermined visualization of the results provided by the processor. Furthermore, the signal processing chip may compute specific measurement functions, for example, an analysis of data in order to determine a maximum value or minimum value, a mean value or any other statistical analysis. Furthermore, a measurement function performed by the signal processing chip may determine a rising or falling a time of a signal and a determination of a frequency or a period time or any other kind of measurement analysis. For example, the signal processing chip may determine a histogram or compute any other kind of characteristics of the results provided by the processor. The signal processing chip may also perform predetermined transformations such as a fast Fourier transform or the like. Furthermore, the signal processing chip may perform specific filtering operations such as a low path filtering, a high pass filtering or a band pass filtering or any other kind of digital filtering.

In a possible embodiment, the processor is included in the signal processing chip.

For example, the signal processing chip may be a processing device comprising processing capabilities for executing predetermined operations in a very efficient manner. In addition to this, the signal processing chip may also comprise a processing unit for executing any kind of software code. In this way, specialized processing capabilities and a general purpose processor sections such as a central processing unit will be combined in a single unit, especially a single chip. In this way, the processor and the specialized capabilities of the signal processing chips can be interact with each in a very efficient manner.

In a possible embodiment, the device for processing data samples comprises an acquisition device. The acquisition device may comprise an input interface for receiving a signal. The acquisition device may further comprise a digitizing unit for digitizing the received signal. In particular, the received signal may be digitized to data samples. The digitized data samples may be stored in the acquisition memory.

In a possible embodiment, the device for processing data samples comprises a memory controller. The memory controller may be configured to control data transfer between the acquisition memory and the processor. Further, the memory controller may control a data transfer between the acquisition memory and the signal processing chip.

In this way, data stored in the acquisition memory may be provided either to the processor or to the signal processing chip. However, it may be also possible that the processor and the signal processing chip may provide the respective processing results to the memory controller and the memory controller stores the processing results in the acquisition memory. Especially, it is possible to transfer data, in particular processing results from the processor via the acquisition memory to the signal processing chip and vice versa. In this way, data communication between the processor and the signal processing chip can be realized.

In a possible embodiment, the processor comprises a processor memory. Furthermore, the device for processing data samples may comprise a direct memory access controller. The direct memory access controller may be configured to control direct data transfer between the signal processing chip and the processor memory of the processor.

In this way, the data, in particular the processing results may be directly forwarded from the processor to the signal processing chip and vice versa. Thus, an efficient data transfer between the signal processing chip and the controller can be achieved.

In a possible embodiment, the device for processing data samples comprises an output device. The output device may be communicatively coupled to the signal processing device. Further, the signal processing chip may be configured to process the processing results of the processor for outputting the processing results on the output device.

Accordingly, the result of processing by the processor can be further prepared by the signal processing chip for output, in particular for visualization. Since the signal processing chip may be specifically configured for an efficient visualization of data, such visualization operations can be performed very fast without any computational load of the general purpose processor.

In a possible embodiment, the processor and the signal processing chip are configured for multiple exchange of processing results between each other.

Accordingly, a sequence of multiple processing operations can be performed, wherein each of the processor and the signal processing chip performs some of these tasks. For each of these tasks is may be determined, which of the processor and the signal processing chip can perform the respective task in a most efficient manner, and accordingly, the respective operation is performed by the related device of the processor or the signal processing chip. In this way, the efficiency for the specialized operations by the signal processing chip can be fully used, wherein the remaining operations, which cannot be performed by the signal processing chips are taken over by the general purpose processor.

With the present invention it is therefore possible to perform a sequence of multiple processing tasks by performing some of the tasks by a specialized signal processing chip and performing the remaining tasks by a general purpose processor. In particular, each task may be performed by the general purpose processor or the signal processing chip depending on the respective computing capabilities. Especially, it is possible that the signal processing chip may even take over further processing operations after the general purpose processor has performed previous processing operations.

The before-mentioned scheme of performing processing tasks by the general purpose processor and the specialized signal processing chip may be applied, for example by a measurement device such as an oscilloscope, a signal analyzer, a spectrum analyzer or any other kind of appropriate measurement device.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

Figure 1:
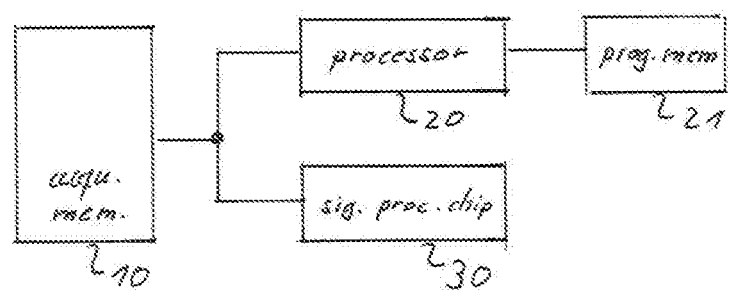
FIG. 1: shows a schematic block diagram of a device for processing data samples according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The embodiments in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a schematic block diagram of a device 1 for processing data samples. The device 1 for processing data samples may comprise an acquisition memory 10. This acquisition memory 10 may be used for storing a number of data samples. The data samples may relate, for example, to digitize data of a signal, for example a measurement signal. Each data sample may comprise at least one bit. However, each data sample may also comprise multiple bits, for example a byte or even multiple bytes. For example, each measurement sample may relate to a digitized measurement value.

The device 1 for processing the data samples may further comprise a general purpose processor 20, for example a central processing unit (CPU). The processor 20 may be communicatively coupled with a program memory 21. However, it may be also possible that program memory 21 may be included in the processor 20. Program memory 21 may store software code comprising instructions. Accordingly, processor 20 may read the instructions of the software code stored in program memory 21 and execute the respective instructions.

Furthermore, processor 20 may be communicatively coupled with acquisition memory 10. Accordingly, processor 20 may read the data samples stored in acquisition memory 10 or processor 20 may receive the data samples stored in acquisition memory 20, which are forwarded to processor 20. Accordingly, processor 20 may execute the instructions of the software codes stored in program memory 21 in order to perform a processing of the data samples from acquisition memory 10.

Furthermore, the device 1 for processing the data samples may comprise a signal processing chip 30. This signal processing chip 30 may be, for example, a field-programmable gate array (FPGA), an application specific integrated circuit (ASIC) or a digital signal processor (DSP). The signal processing chip may be also a combination of an FPGA, ASIC and/or DSP or any other kind of appropriate signal processing chip. In particular, signal processing chip 30 may be a device, which can perform predetermined operations. In particular, the signal processing chip 30 can perform the predetermined operations in a very efficient manner. For example, the predetermined operations may be firmly specified in the signal processing chip. However, it may be also possible, that the predetermined operations may be modified, in particular by a specific configuration operation. In any case, the signal processing chip 30 may be limited to these specific predetermined operations.

For example, the specific operations of the signal processing chip 30 may relate to operations in order to prepare data for a specific output operation, for example a visualization of the data or output device such as a display or the like. In such a case, the signal processing chip 30 may be or include, for example, a graphic processor. However, the specific operations may also relate to any other kind of operations, for example specific transforms such as a fast Fourier transform or the like, specific features of measurement operations such as identifying a minimum, a maximum, a rising or falling time, statistical analysis such as determining a mean value, a standard deviation, or computing a histogram, for example a histogram of a frequency distribution. However, it is understood, that any other kind of specified operations may be also performed by the signal processing chip 30.

In a conventional system, signal processing chip 30 may read data, for example from acquisition memory 10, and apply one or more predetermined operations. Subsequently, further operations may be performed by a general purpose processor (if necessary). However, once the general purpose processor has taken over the processing of the data, all further processing operations are performed by the general purpose processor.

In contrast to this, processor 20 of the device 1 for processing the data samples may provide processing results to the signal processing chip 30 for a further processing according to specific predetermined operations of the signal processing chip 30. In this way, it is possible that the control of performing operations may change multiple times between the processor 20 and the signal processing chip 30. Accordingly, operations, which can be performed more efficiently by signal processing chip 30 can be performed by this signal processing chip 30 even if processor 20 has performed some processing operations on the related data samples before. Thus, the total processing of the data samples can be performed more efficiently, and consequently faster. Further to this, since more operations can be performed by signal processing chip 30, the computational load of processor 20 can be reduced. Accordingly, the throughput of the device 1 for processing the data samples can be also improved.

In the example according to FIG. 1, each of the processor 20 and the signal processing chip 30 may obtain the input data, especially the raw data samples and/or the processed data samples from acquisition memory 10. For example, processor 20 may receive the raw data samples from acquisition memory 10 and perform some processing according to the instructions of the software code stored in program memory 21. After processing 20 has finished the respective operations, the results of the processing is stored in acquisition memory 10. Thus, signal processing chip 30 may read the intermediate results according to the processing of processor 20 from acquisition memory 10 and apply further processing operations on the results of the processor 20. It is understood, that this scheme of processing and data exchange may be also applied in the other direction, i.e. signal processing chip 30 may perform a specific processing operation and store the results in acquisition memory 10, and in response to this, processor 20 may read this results may perform further processing on the results of signal processing chip 30.

It may be also possible that processor 20 may directly forward processing results to signal processing chip 30 and/or signal processing chip 30 may forward processing results to processor 20 without storing the results in acquisition memory 10 or another external memory. For this purpose, a direct communication between the processor 20 and the signal processing chip 30 may be used. For example, processor 20 and signal processing chip 30 may be communicatively coupled by a communication bus or the like.

Figure 2:
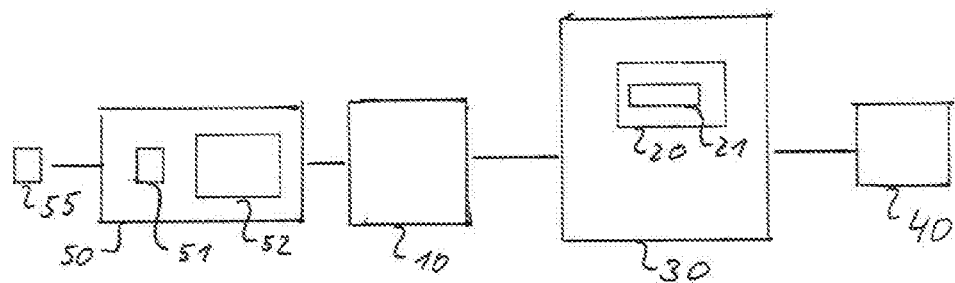
FIG. 2: shows a schematic block diagram of a device for processing data samples according to a further embodiment.

FIG. 2 shows a further example of a device for processing data samples according to an embodiment. In this example, processor 20 may be included in the signal processing chip 30. Furthermore, it may be even possible that the program memory 21 for storing the software code, which is executed by processor 20, may be also included in signal processing chip 30 or even within the processor 20. In this way, a very efficient data exchange between the processor 20 and the further entities of signal processing chip 30 for performing the predetermined instructions can be achieved.

As can be further seen in FIG. 2, signal processing chip 30 may be coupled to an output device 40, for example a display. Accordingly, the processing results can be output, in particular visualized on output device 40. For example, signal processing chip 30 may generate a visualization, for example a graphical representation based on the data samples provided by acquisition memory 10.

As already mentioned above, the data samples stored in acquisition memory 10 may relate to any kind of data. For example, the data samples may relate to one or more measurement signals. For example, a probe 55 may measure a signal and provide the one or more measured signals to an acquisition device 50. Accordingly, an input interface 51 may receive the signal from probe 55 and provide the received signal to a digitizing unit 52. For example, digitizing unit 52 may comprise elements such as an attenuator, an amplifier, a filter or the like. Furthermore, digitizing unit 52 may comprise an analogue-to-digital converter for converting an analogue signal to digital data. Accordingly, the digital data may be stored as data samples in acquisition memory 10. Each data sample may comprise at least one bit. However, in order to further improve the accuracy, the individual data samples may comprise multiple bits. For example, each data sample may comprise multiple bits for specifying a measurement value. However, each data sample may relate even to multiple values, in particular multiple values, which are related with each other. For example, a data sample may comprise a first value relating to a current and a second value relating to a related voltage.

Figure 3:
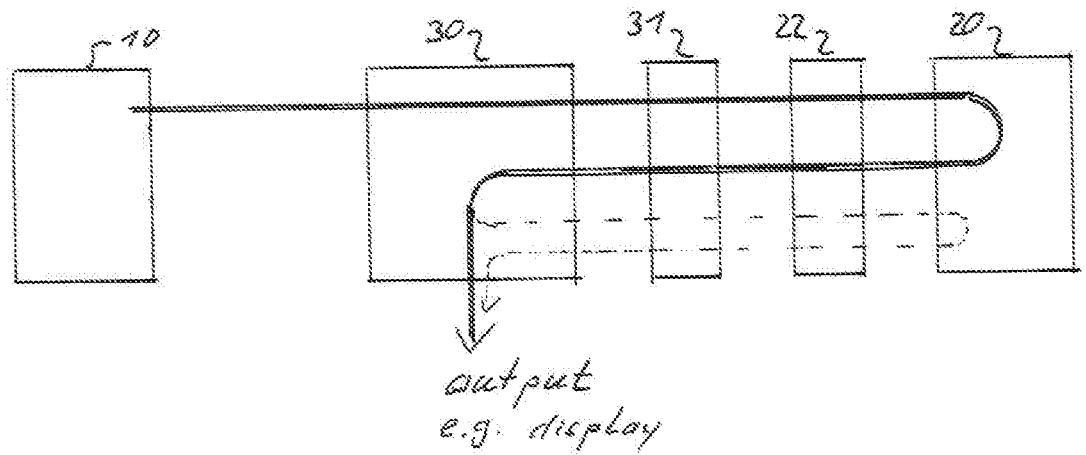
FIG. 3: shows a schematic illustration of a data flow through a device for processing data samples according to an embodiment.

FIG. 3 shows a schematic diagram of a data flow through the individual elements of a device 1 for processing samples according to an embodiment. In the example according to FIG. 3, a data sample may be read by signal processing device 30 from acquisition memory 10. For example, signal processing chip 30 may perform a first processing on the data sample from acquisition memory 10. The result of this first processing may be forwarded to processor 20. For this purpose, the data may be transferred by a direct memory access controller 31 from the signal processing chip 30 to a processor memory 32 of the processor 20. Accordingly, processor 20 may use the data stored in processor memory 22 in order to perform a further processing on this data according to the instructions of the software code provided to processor 20. After processor 20 has completed the processing, the data may be provided to signal processing chip 30 for further processing operations. For example, the processing result of processor 20 may be stored in processor memory 32, and signal processing chip 30 may read the data through direct memory access controller 31. Accordingly, signal processing chip 30 may perform a further processing on the processing result from processor 20. This processing result may be provided to an output device 40. Alternatively, the result of signal processing chip 30 may be forwarded once again to processor 20 for further processing.

Figure 4:
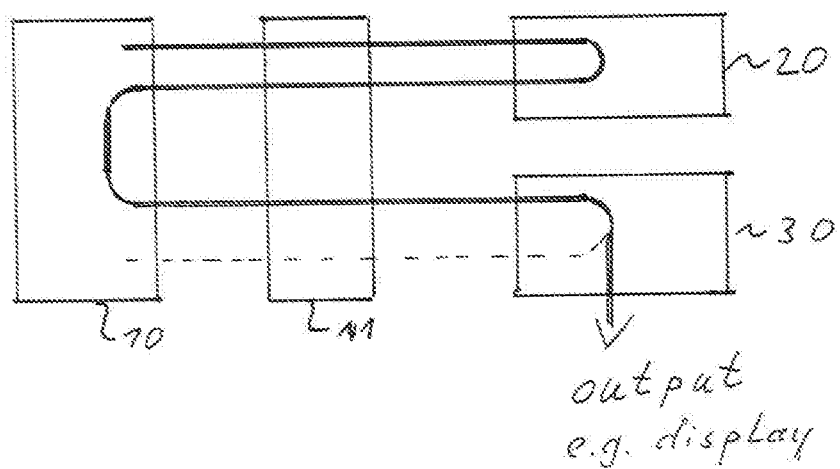
FIG. 4: shows a schematic diagram of a data flow through a device for processing data samples according to a further embodiment.

FIG. 4 shows a data flow through the individual entities of a device 1 for processing data samples according to another embodiment. As can be seen in this example, the data exchange between the processor 20 and the signal processing chip 30 is performed by means of the acquisition memory 10. For example, a data sample is provided to processor 20 via a memory controller 11, and the result of the processing by processor 20 is stored in acquisition memory 10 via memory controller 11. Further, signal processing chip 30 may also obtain the result of processor 20, which is stored in acquisition memory 10 via memory controller 11. Accordingly, signal processing chip 30 can perform further processing operations on the processing result of processor 20. The result of signal processing chip 30 may be forwarded to an output device 40, for example a display. Alternatively, signal processing chip 30 may also store the result of the processing in acquisition memory 10. Accordingly, the result of signal processing chip 30 may be provided to processor 20 for further processing operation.

Figure 5:
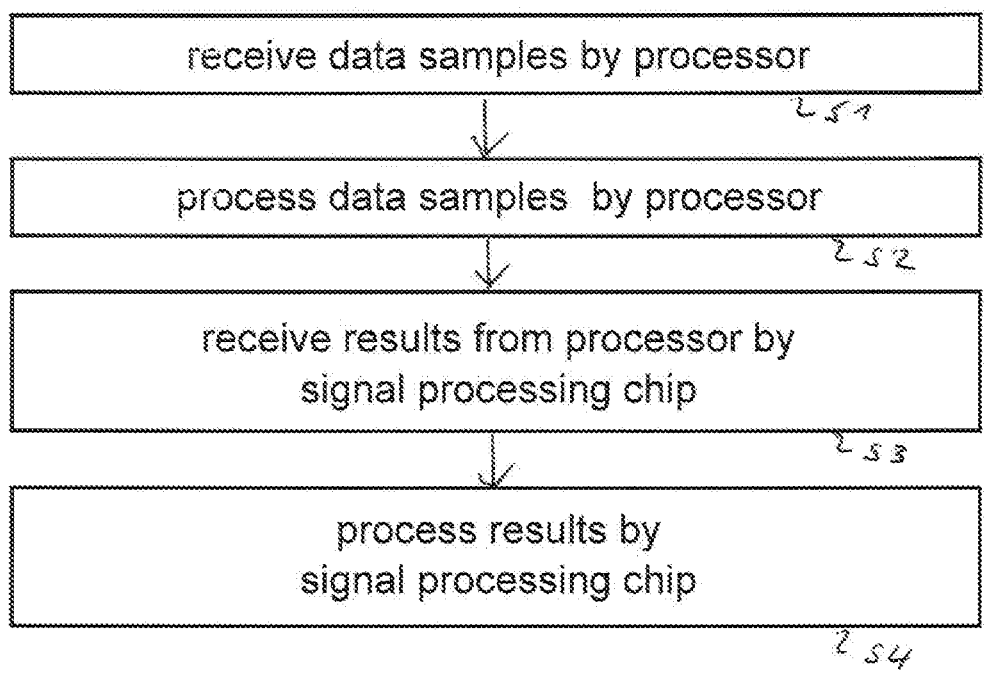
FIG. 5: shows a flow diagram of a method for processing data samples according to an embodiment.

FIG. 5 shows a flow diagram of a method for processing data samples according to an embodiment. It is understood, that the method for processing data samples may comprise any kind of step, which have been described above in connection with the device 1 for processing data samples. Furthermore, the device 1 for processing data samples may comprise any kind of element for performing an operation as described below in connection with the method for processing data samples.

In step S1, a number of data samples may be received by a processor 20. The data samples may be received from an acquisition memory 10, wherein the data samples are stored in this acquisition memory 10 before. In step S2, the received number of data samples are processed by the processor 20. For this purpose, processor 20 may execute software code. This software code may be stored, for example, in a program memory 21. In step S3, a signal processing chip 30 may receive the results of the processing by processor 20. In step S4, the signal processing chip 30 applies predetermined processing operations on the received processing results of the processor 20.

Summarizing, the present invention relates to a processing of data samples by an arrangement comprising a signal processing chip for executing predetermined operations and a processor for executing any kind of software code. In particular, it is not only possible that the general purpose processor, which executes the software code can process results from the signal processing chip, but also the signal processing chip can receive the results of the general purpose processor for applying further operations. In this way, the flexibility and efficiency of the processing can be further improved.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 device for processing data samples
10 acquisition memory
11 memory controller
20 processor
21 program memory
22 processor memory
30 signal processing chip
31 DMA controller
40 output device
50 acquisition device
51 input interface
52 digitizing unit
55 probe

The invention claimed is:

1. A device for processing data samples, the device comprising:
   an acquisition memory for storing a number of data samples;
   a program memory for storing software code;
   a processor for receiving the number of data samples stored in the acquisition memory and for processing of the received number of data samples by executing the software code stored in the program memory;
   a signal processing chip for executing one or more specified predetermined operations to generate the number of data samples as an intermediate result, receiving a processing result of the number of data samples processed by the processor and performing further processing operations on the processing result of the processor,
   wherein the processor and the signal processing chip are configured for multiple exchange of processing results between each other,
   wherein once the processor detects that the further processing operations can be performed faster or more efficiently by the signal processing chip, the processing result of the processor is forwarded to the signal processing chip, and
   wherein the aquisition memory is configured to receive the number of data samples from the signal processing chip.

2. The device of claim 1, wherein each data sample comprises a number of one or more bits, and each data sample represents a digitized signal.

3. The device of claim 1, wherein the acquisition memory comprises a shared memory which is used at least by the processor and the signal processing chip.

4. The device of claim 1, wherein the signal processing chip comprises at least one or a field programmable gate array, an application-specific integrated circuit, a digital signal processor or a combination thereof.

5. The device of claim 1, wherein the signal processing chip is configured to perform at least one of processing of data for a visualization, computing a measurement function, computing a histogram, performing a predetermined transformation operation or applying a filtering operation.

6. The device of claim 1, wherein the processor is included in the signal processing chip.

7. The device of claim 1, comprising an acquisition device, wherein the acquisition device includes an input interface for receiving a signal and a digitizing unit for digitizing the received signal to data samples and storing the digitized data samples into the acquisition memory.

8. The device of claim 1, comprising a memory controller for controlling data transfer between the acquisition memory and the processor and data transfer between the acquisition memory and the signal processing chip.

9. The device of claim 1, wherein the processor comprises a processor memory, and
   the device for processing data samples comprises a direct memory access controller for controlling direct data transfer between the signal processing chip and the processor memory of the processor.

10. The device of claim 1, comprising an output device communicatively coupled to the signal processing device, wherein the signal processing chip is configured to process the processing result of the processor for outputting on the output device.

11. A method for processing data samples, the method comprising:
- executing, by a signal processing chip, one or more specified predetermined operations to generate a number of data samples as an intermediate result;
- storing, by an acquisition memory, the number of data samples;
- receiving, by a processor, the number of data samples stored in the acquisition memory;
- processing, by the processor, the received number of data samples by executing software code;
- receiving, by the signal processing chip, processing results of the processor, once the processor detects that further processing operations can be performed faster or more efficiently by the signal processing chip; and
- perform, by the signal processing chip, the further processing operations on the received processing result of the processor,
- wherein data exchange is performed between the processor and the signal processing chip while processing a data sample.

12. The method of claim 1, wherein each data sample comprises a number of one or more bits, and each data sample represents a digitized signal.

13. The method of claim 1, wherein data are transferred between the processor and the signal processing chip by a shared memory of the acquisition memory.

14. The method of claim 1, wherein the signal processing chip applies the predetermined operations by at least one or a field programmable gate array, an application-specific integrated circuit, a digital signal processor or a combination thereof.

15. The method of claim 1, wherein the predetermined operations perform at least one of processing of data for a visualization, computing a measurement function, computing a histogram, performing a predetermined transformation operation or applying a filtering operation.

16. The method of claim 1, wherein the processor is included in the signal processing chip.

17. The method of claim 1, comprising:
- receiving, by an acquisition device, a signal by an input interface;
- digitizing, by a digitizer included in the acquisition device, the received signal to data samples by a digitizing unit; and
- storing, by the digitizer, the digitized data samples into the acquisition memory.

18. The method of claim 1, comprising controlling, by a memory controller, data transfer between the acquisition memory and the processor and data transfer between the acquisition memory and the signal processing chip.

19. The method of claim 1, comprising controlling direct data transfer between the signal processing chip and a processor memory of the processor by a direct memory access controller.

20. The method of claim 1, wherein applying the predetermined processing operations comprises processing the processing result of the processor for outputting data on an output device.

* * * * *